United States Patent [19]
Thomas

[11] 3,965,447
[45] June 22, 1976

[54] SYNTHETIC REACTOR CIRCUIT

[75] Inventor: Robert M. Thomas, Brockville, Canada

[73] Assignee: GTE Automatic Electric Laboratories Incorporated, Northlake, Ill.

[22] Filed: Jan. 6, 1975

[21] Appl. No.: 538,985

Related U.S. Application Data

[62] Division of Ser. No. 415,481, Nov. 13, 1973.

[52] U.S. Cl. .............................. 333/80 T; 307/230; 330/107
[51] Int. Cl.² ...................................... H03H 11/00
[58] Field of Search ............. 333/80 R, 80 T; 330/9, 330/107, 109; 307/295, 230

[56] References Cited
UNITED STATES PATENTS

| | | | |
|---|---|---|---|
| 3,643,173 | 2/1972 | Whitten | 330/107 X |
| 3,772,604 | 11/1973 | Hogg et al. | 307/230 X |

*Primary Examiner*—Paul L. Gensler

[57] ABSTRACT

Communication system interface circuits for bi-directional transmission of signals between terminal sets, each interface circuit comprising a transformer including first winding means coupled through rectifier means and a low-pass filter to a first terminal set and including second winding means having end terminals coupled through diodes to the output of a high frequency inverter and having a center tap coupled through an inductive impedance to a neutral circuit point, a second terminal set being coupled across the inductive impedance. The first terminal set may be connected to a telephone subset with ringing and bias signals being applied in circuit with the inductive impedance. The inductive impedance includes transistor means controlled by an operational amplifier which is controlled from a resistance-capacitance phase-shift means, the impedance being equivalent to that of an inductance and a series resistance.

2 Claims, 9 Drawing Figures

SYNTHETIC REACTOR CIRCUIT

CROSS-REFERENCES TO RELATED APPLICATIONS

This is a division of application Ser. No. 415,481, filed Nov. 13, 1973.

BACKGROUND OF THE INVENTION

I. Field of the Invention

This invention relates to communications system interface circuits and more particularly to interface circuits for efficient transmission of signals such as in an electronic terminating junctor and has a line interface device between telephone lines and electronic networks. The circuit of this invention uses inexpensive and compact parts and is readily and economically manufacturable.

II. Background of the Prior Art

In communications systems such as telephone systems, it is common practice to establish a direct metallic path between a pair of terminal sets for bi-directional transmission of signals therebetween. With a direct metallic path, undesired signals such as transient voltage surges are transmitted along with the desired signals and also the impedances at the interconnected terminal sets must be equal to obtain an impedance match. Impedance matching is oftentimes important, especially when establishing interfaces such as between telephone lines and electronic networks. Conventional transformers may be used for isolation and also to obtain an impedance match, but such are bulky and expensive when low frequency signals such as audio signals are to be transmitted.

SUMMARY OF THE INVENTION

This invention was evolved with the general object of overcoming the disadvantages of prior art arrangements. A more specific object of the invention is to provide a synthetic inductor circuit which simulates the operation of a conventional inductor without requiring coils wound on a core of material.

In accordance with this invention, a pair of coupling means are provided for coupling a pair of terminal sets to a pair of windingmeans of a transformer means to which high frequency pulses are applied, each coupling means being arranged to develop a signal at the corresponding terminal set corresponding to the magnitude of pulses in the corresponding winding means and each coupling means being also responsive to a signal applied to the corresponding terminal set to control the magnitude of the pulses in the corresponding winding means and thereby the magnitude of pulses in the other of the winding means. Thus signals can be transmitted in either direction, from either of the terminal sets to the other. At the same time, isolation is provided, there being no direct metallic path between the terminal sets. Also, any desired impedance match may be obtained. A very important advantage is that since the transformer means is operative in conjunction with high frequency pulses, the size thereof can be quite small and also the transformer means can be quite inexpensive.

The high frequency pulses are applied to one of the winding means which preferably has a center tap coupled to a neutral circuit point, with current pulses being alternately conducted between the neutral circuit point and end terminals of the center-tapped winding means.

An inverter-type circuit may be employed, with a voltage source between the center tap and the neutral circuit point and with alternately conductive transistors between the neutral circuit point and the end terminals. Alternatively, a separate inverter-type circuit may be used, coupled to the neutral circuit point and through diodes to the end terminals of the center-tapped winding means.

One of the coupling means includes impedance means coupled between the center tap of the center-tapped winding and the neutral circuit point to develop a signal at the correspoinding terminal set corresponding to the magnitude of pulses in the center-tapped winding, while being responsive to a signal applied to the corresponding terminal set to control the magnitude of the pulses in the center-tapped winding means and thereby the magnitude of the pulses in the other winding means.

The other coupling means includes rectifier or detector means, preferably having a full-wave bridge configuration, with lowpass filter means coupling the output of the rectifier means to the corresponding terminal set.

An important feature relates to a circuit referred to herein as a synthetic inductor circuit which uses an operational amplifier, transistor means and resistance and capacitance components to provide an impedance equivalent to that of an inductor with a series resistance.

This invention contemplates other objects, features and advantages which will become more fully apparent from the following detailed description taken in conjunction with the accompanying drawings.

BASIC THEORY

Figure 1:
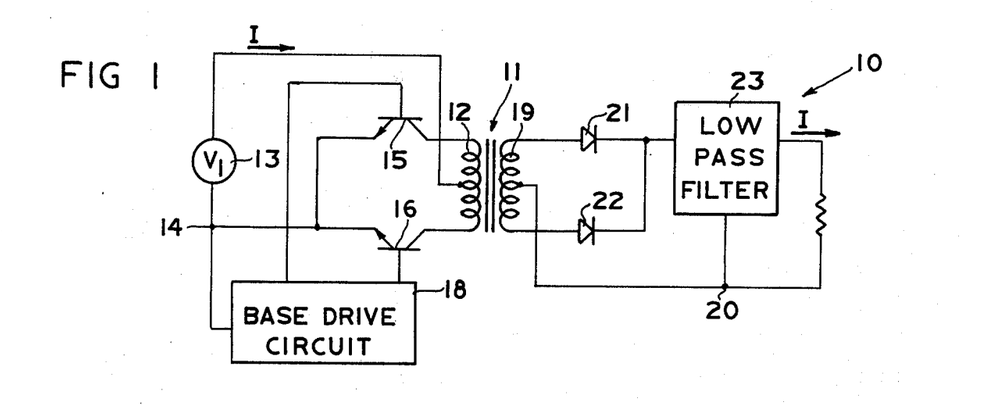
FIG. 1 shows a basic inverter circuit for explanation of the theory of operation of the interface circuits of the invention.

Referring to FIG. 1, reference numeral 10 generally designates a circuit for explanation of the basic theory of the invention. Circuit 10 comprises an inverter circuit of the type commonly used for power conversion and includes a transformer 11 having a primary winding 12 which has a center tap connected to the positive terminal of a source 13 of a voltage $V_1$, the negative terminal of which is connected to a neutral circuit point 14 and to the emitters of a pair of transistors 15 and 16 the collectors of which are connected to end terminals of the primary winding 12. The base electrodes of transistors 15 and 16 are connected to a base drive circuit 18 operative to render the transistors 15 and 16 alternately conductive, a voltage $2V_1$ being thereby developed across the primary winding 12.

The transformer 11 has a secondary winding having a center tap connected to a circuit point 20 and having end terminals connected through rectifier diodes 21 and 22 to the input of a low pass filter 23, a load resistor 24 being connected between the circuit point 20 and the output of the filter 23.

The voltage developed across the secondary winding 19 is $2V_1N_2/N_1$ and the recrifier output is thereby $V_1N_2/N_1$, $N_1$ being the number of turns of the primary winding 12 and $N_2$ being the number of turns of the secondary winding 19. The output current is given by the equation:

$$I = \frac{V_1 N_2}{R_1 N_1}.$$

$R_1$ being the resistance of the load resistor 24. Thus the circuit operates as a transforer with response down to D.C.

Figure 2:
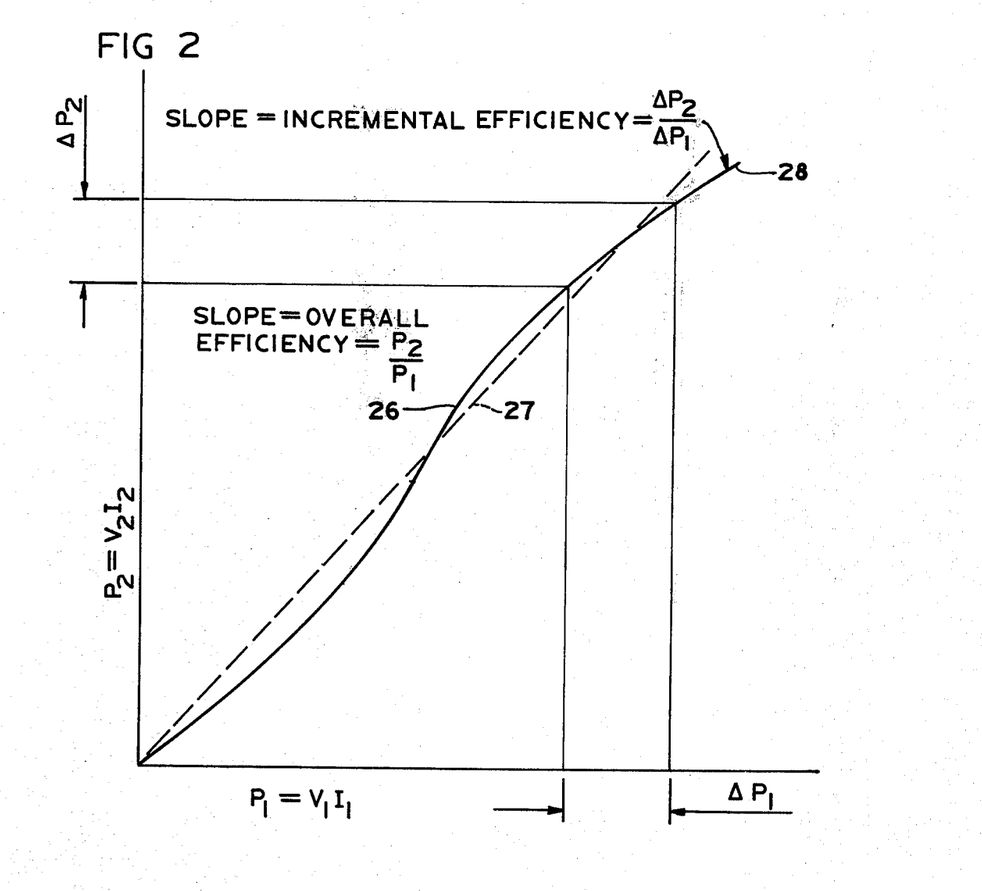
FIG. 2 is a graph showing the relationship between powers in different portions of the circuit.

Small variations in $V_1$ (i.e. an audio signal superimposed on $V_1$) are also transferred to the secondary side. The attenuation of audio signals is governed by the incremental power converstion efficiency of the circuit. With reference to FIG. 2, line 26 shows the relationship of power $P_2$ in the secondary side to power $P_1$ in the primary side, the overall efficiency being indicated by dotted line 27. A small change $\Delta P_1$ in power input produces a small change $\Delta P_2$ in output, the slope of a line 28 being the incremental efficiency $\Delta P_2/\Delta P_1$.

Figure 3:
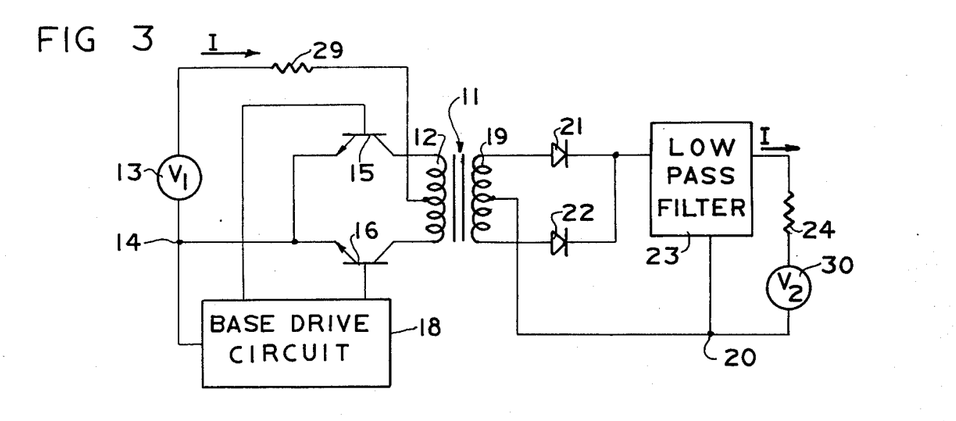
FIG. 3 shows a circuit like that of FIG. 1, but with an additional voltage applied for further explanation of the operation.

FIG. 3 shows the same circuit as FIG. 1, with a resistor 29 in series with the voltage source 13 and with a voltage source 30 in series with the load resistor 24, producing a small voltage $V_2$ in the secondary side. The output current is expressed by the Equation:

$$I_2 = \left( V_1 \frac{N_2}{N_1} - V_2 \right) \frac{1}{R_L}$$

Since $I_1 = I_2 N_2/N_1$, it follows that:

$$I_1 = \frac{N_2}{N_1} \left( V_1 \frac{N_2}{N_1} - V_2 \right) \frac{1}{R_L}$$
$$= \frac{V_1 N_2^2}{R_L N_1^2} - \frac{V_2 N_2}{R_L N_1}$$

It can be seen that the circuit operates as a transformer in the reverse direction provided that the voltages are such that $I_2$ is greater than zero at all times. Small DC or audio signals can therefore be passed through the circuit in either direction. It may also be noted that an alternate proof is possible using the Reciprocity theorem.

Figure 4:
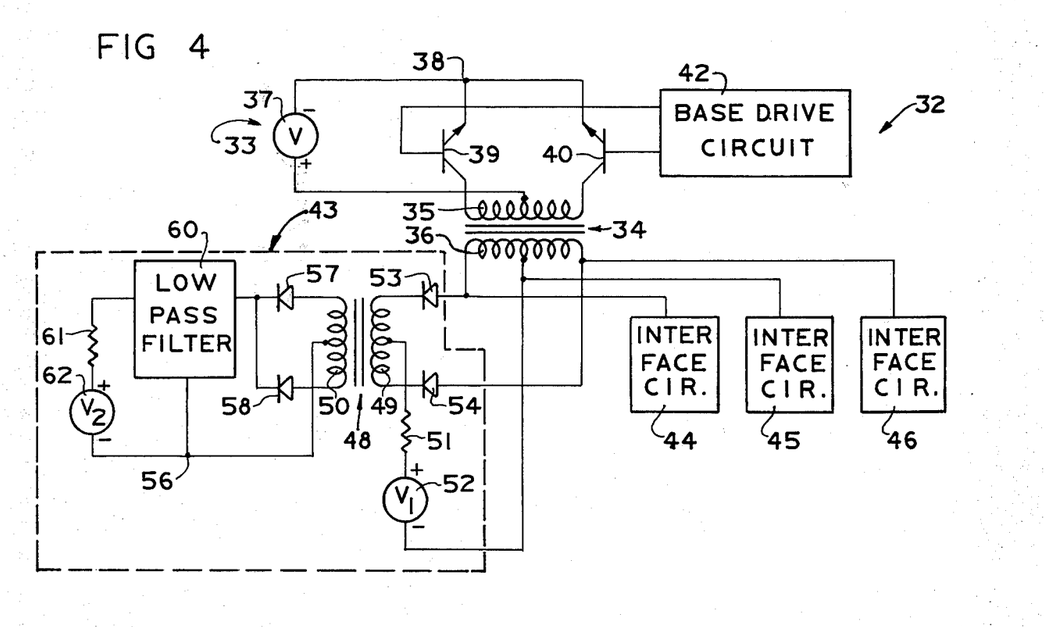
FIG. 4 shows an alternative version of the circuit of FIG. 3, with a common energizing source for a group of circuits.

FIG. 4 shows an alternative circuit arrangement 32 wherein one inverter is common to a group of circuits, having the advantage of lower cost per circuit. As shown, an inverter 33 is provided induding a transformer 34 having a primary winding 35 and a secondary winding 36. A voltage source 37 is connected between a center tap of the primary winding 35 and a circuit point 38 connected to the emitters of a pair of transistors 39 and 40 having collectors connected to end terminals of the primary winding 35 and having base electrodes connected to a base drive circuit 42 operative to render the transistors 39 and 40 alternately conductive. End terminals of the secondary winding 36 and a center tap thereof are connected to a plurality of circuits 43-46 which are of the same form. As shown, circuit 43 comprises a transformer 48 having primary winding and secondary winding 49 and 50. A center tap of the primary winding 49 is connected through a resistor 51 to one terminal of a source 52 of a signal voltage $V_1$, the other terminal of source 52 being connected to the center tap of winding 36. End terminals of the winding 49 are connected through diodes 53 and 54 to end terminals of the winding 36.

The center tap of secondary winding 50 is connected to a circuit point 56 while end terminals thereof are connected through diodes 57 and 58 to an input of a low pass filter 60 the output of which is connected to circuit point 56 through a resistor 61 and a source 62 of a signal voltage $V_2$.

The operation of the circuit 43 is similar to the circuit of FIG. 3, variations in the magnitude of the voltage $V_1$ of signal source 52 producing changes in the amplitude of current pulses in winding 49, producing corresponding changes in the amplitude of the voltage in the secondary winding 50 and in the rectified and filtered output at the output of the low-pass filter 60. Similarly, changes in the magnitude of the voltage $V_2$ change the magnitude of current pulses in the secondary winding 50, thereby affecting the magnitude of current pulses in the primary winding 52 to affect the voltage between the center taps of windings 49 and 36. Thus signals are passed in either direction through the circuit. It is noted that the signal sources 52 and 62 are voltage sources as diagrammatically illustrated but since there is always a DC current in the same direction, therethrough, they can be in the form of variable impedances such as a carbon type microphone, for example, producing a modulation of the current and thereby a variable voltage. Accordingly, the circuit 43 may be used to interconnect a pair of terminal sets for bi-directional transmission of signals therebetween with the signals being in the form of either variable voltages or variable impedances.

DESCRIPTION OF PREFERRED EMBODIMENTS

Figure 5:
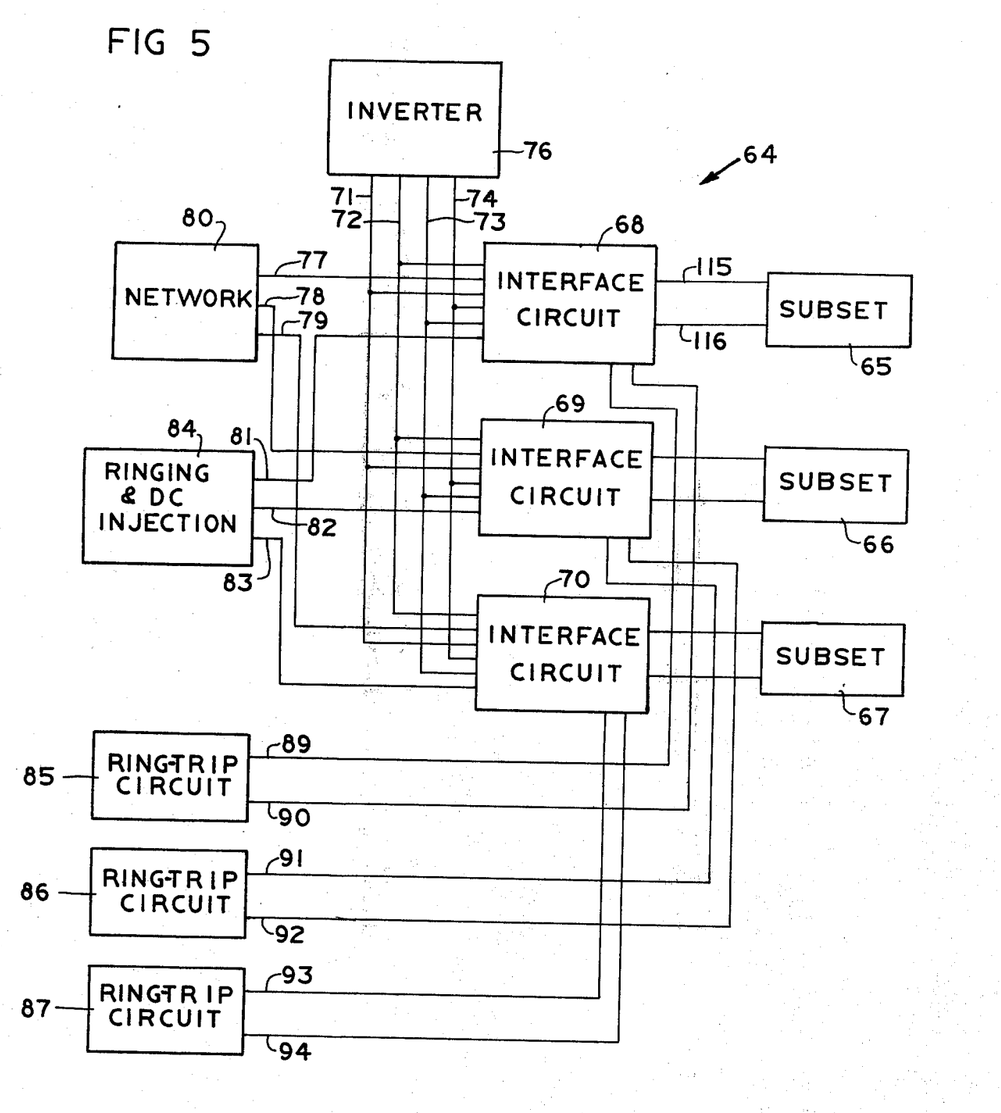
FIG. 5 is a block diagram illustrating a portion of a telephone system incorporating interface circuits and other features of the invention.

FIG. 5 is a block diagram of a portion of a telephone system 64 incorporating interface circuitry according to the invention. Three subsets 65-67 are illustrated, it being understood that a much greater number may be employed. Subsets 65-67 are connected to interface circuits 68-70 which are connected through lines 71-74 to a common inverter 76, through lines 77-79 to a network 80 and through lines 81-83 to a ringing and DC injection circuit 84. Ring-trip circuits 85-87 are connected to the interface circuits 65-67 through pairs of lines 89 and 90, 91 and 92 and 93 and 94.

Figure 6:
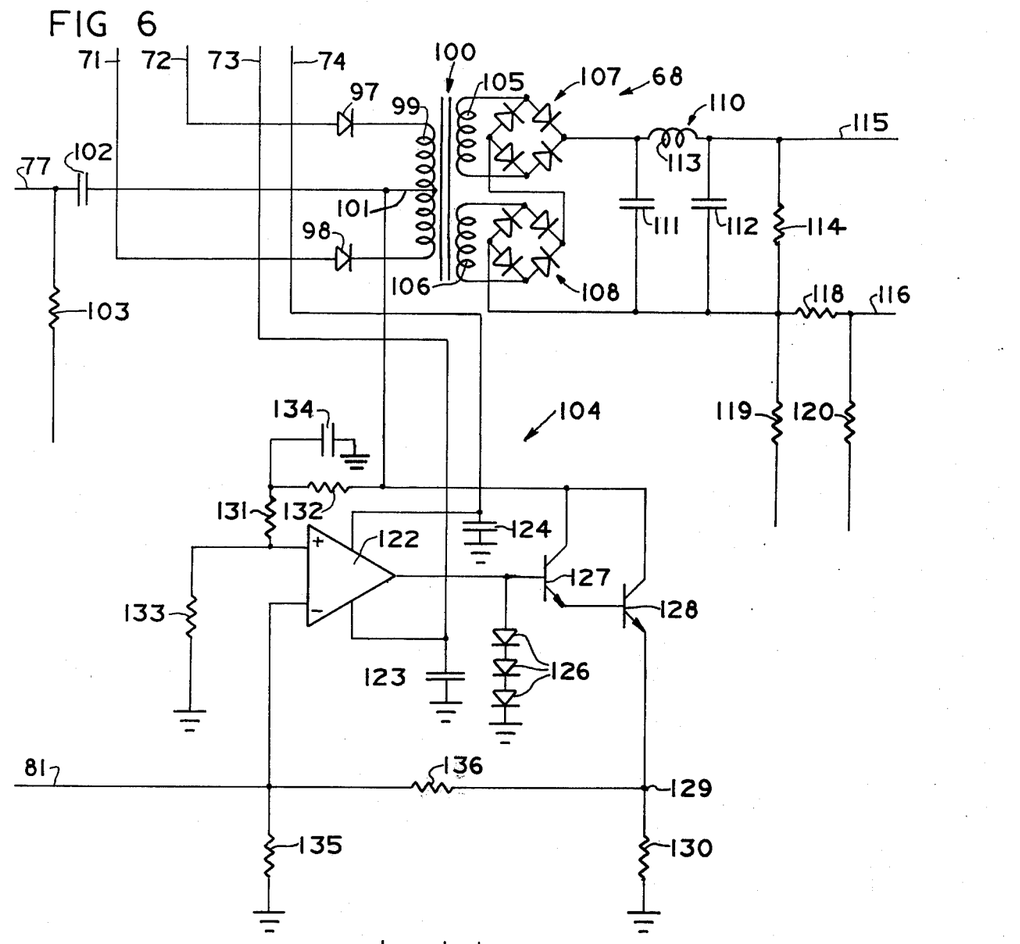
FIG. 6 is a schematic diagram of an interface circuit of the system of FIG. 5.

FIG. 6 is a circuit diagram of the interface circuit 68. Lines 71 and 72 supply a square wave signal from the inverter 76 at a high frequency in relation to the highest frequency component of the signals to be transmitted through the interface circuit 68. For transmission of audio frequency signals, the frequency of the square wave signal may be 200 KHz, by way of example. Lines 71 and 72 are connected through diodes 97 and 98 to a primary winding 99 of a transformer 100. Primary winding 99 has a center tap 101 connected through a capacitor 102 to the line 77 which is connected through a resistor 103 to ground. Center tap 101 is also coupled to ground through a synthetic inductor circuit 104 forming an important feature of the invention as hereinafter described.

Transformer 100 has a pair of secondary windings 105 and 106 connected to diode bridge rectifier circuits 107 and 108 the outputs of which are connected in series and to the input of a low pass filter 110 formed by a pair of shunt capacitors 111 and 112 and a series inductor 113 with a load resistor 114 being connected across the output of the low pass filter 110. Lines 115 and 116 connect the subset 65 and the output of the low pass filter 110, a resistance 118 being connected in series with line 116, with opposite ends of resistor 118 being connected through resistors 119 and 120, and lines 89 and 90 to the ring-trip circuit 85.

In operation, current pulses are applied alternately from lines 71 and 72 and through diodes 97 and 98 to the ends of the primary winding 99, developing a square wave voltage across a primary winding 99 and a corresponding square wave voltage across the secondary windings 105 and 106 which are rectified, added and filtered to produce a DC voltage across the resistor 114. In signal transmission from the subset 65 to the network 80, a signal applied between lines 115 and 116, either in the form of a change in voltage or a change of impedance, produces a change in the current in the secondary windings 106 and 105, reflecting a change in the current in the primary winding 99 and developing a signal across the resistor 103 which is applied through the line 77 to the network 80. In signal transmission from the network 80 to the subset 65, a signal applied on line 77 changes the current flow through the two halves of the primary winding 99, effecting a change in the square wave voltage as developed across the secondary windings 105 and 106 and thereby a change in the voltage developed across the resistor 114, applied through lines 115 and 116 through the subset 65. It is noted that the synthetic inductor circuit 104 presents a high impedance at audio frequencies.

For ringing operation, a suitable AC signal, at a frequency of 20 Hz for example, is injected through line 81 to the synthetic inductor circuit 104, developing a corresponding signal across the resistor 114 which is applied through lines 115 and 116 to the subset 65. A DC bias signal, if required, may also be applied through line 81.

It is noted that the value of resistor 114 is such as to obtain good ringing performance combined with reasonable ringing signal drain. The value of resistor 103 is such as to provide the proper input impedance, looking from the subset, which may be 900 ohms, for example. In the network, 80, the line 71 may, for example, be coupled through an audio hybrid circuit to a four-wire analog network or to a digital network via appropriate converters.

DC current to the subset 65 is sensed by means of the series current-detection resistor 118, the voltage developed thereacross being applied through resistors 119 and 120 and lines 89 and 90 to the ring-trip circuit 85. It is noted that the ringing potentials are developed on an individual basis and both sides of the current-detection resistor 118 can be near ground potential. Unlike prior circuits, there is no large common mode voltage and no difficulty with respect to isolation and the ring-trip circuitry is simplified.

The synthetic inductor circuit 104 is an important feature of the invention, eliminating the need for a large inductor of conventional form and also being relatively inexpensive. The circuit 104 comprises an operational amplifier 122 supplied with negative and positive operating voltages from lines 73 and 74, bypass capacitors 123 and 124 being connected between ground and the negative and positive supply voltage terminals of amplifier 122. The supply voltages on lines 73 and 74 may be minus 15 volts and plus 15 volts, by way of example.

The output of amplifier 122 is connected to ground through three series diodes 126 and is also connected to the base of a transistor 127 having an emitter connected to the base of a transistor 128 the emitter of which is connected to a circuit point 129, connected through a resistor 130 to ground. The collectors of the transistors 127 and 128 are connected to the center tap 101 of the primary winding 99. The plus input of amplifier 122 is connected through resistors 131 and 132 in series to the center tap 101 of winding 99 and is also connected through a resistor 133 to ground, a capacitor 134 being connected between ground and the junction between resistors 131 and 132. The negative input of amplifier 132 is connected to line 81, through a resistor 135 to ground and through a resistor 136, to the circuit point 129.

For analysis of the operation of the circuit 104, assume that the resistances of resistors 130, 131, 132, 133, 135 and 136 are $R_A$, $R_B$, $R_C$, $R_D$, $R_E$ and $R_F$, respectively as indicated in FIG. 6; $V_C$ is the DC voltage between ground and the collectors of transistors 127 and 128, $I_C$ is the DC current flow to the collectors of transistors 127 and 128, $v_C$ is a small AC voltage superimposed on the DC voltage $V_C$; $i_C$ is the AC current to the collectors of transistors 127 and 128 resulting from the AC voltage $v_C$.

Let G equal the forward gain from the plus input of amplifier 122 to the circuit point 129, equal to:

$$\frac{R_E + R_F}{R_E}$$

It may be assumed that $R_B$ and $R_C$ are both relatively large such that the current flow therethrough is negligible in relation to $I_C$.

With the illustrated circuit $$I_C = V_C \frac{R_D}{R_B} \cdot \frac{1}{R_C + R_D} \cdot \frac{G}{R_A}$$

With respect to DC, the circuit therefore acts as a resistance equal to:

$$\frac{R_A (R_B + R_C + R_D)}{G R_D}$$

Analyzing the AC operation:

$$i_c = \frac{V_c \cdot \frac{G}{R_A} \cdot \frac{R_D}{R_B + R_D} \cdot \frac{R_C + R_D}{R_B + R_C + R_D} \cdot \frac{1}{jwc}}{\frac{(R_B + R_D) R_C}{R_B + R_C + R_D} + \frac{1}{jwc}}$$

Solving for the AC impedance, $$\frac{V_c}{i_c} = \frac{R_A \cdot (R_B + R_C + R_D) \cdot \frac{(R_B + R_D) \cdot R_C}{R_B + R_C + R_D} + \frac{1}{jwc}}{G \cdot R_D \cdot \frac{1}{jwc}}$$

$$= jwc \; \frac{R_A(R_B + R_D) \cdot R_C}{G R_D} + \frac{R_A(R_B + R_C) \cdot R_D}{G R_D}$$

This is the equation for an inductor having an inductance:

$$L = C \; \frac{R_A (R_B + R_D) \cdot R_C}{G R_D}$$

in series with a resistor having a resistance:

$$R = \frac{R_A (R_B + R_C + R_D)}{G R_D}$$

It is desirable to introduce a non-linearity to limit output current which is accomplished by the diodes 126 in the illustrated circuit. Alternatively, a suitable diode or diodes may be connected between ground and the plus input of amplifier 122 which would have the advantage of being less subject to errors caused by the emitter resistance of transistor 128.

Figure 7:
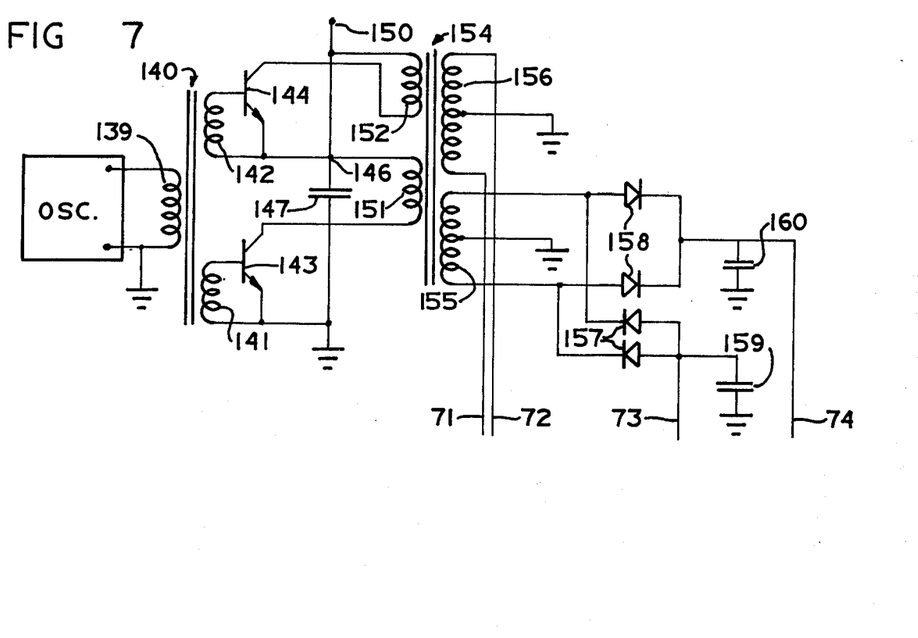
FIG. 7 is a schematic diagram of an inverter circuit of the system of FIG. 5.

Referring to FIG. 7, the inverter circuit 76 comprises an oscillator 138 which supplies a high frequency signal, at 200 KHz for example, to the primary winding 139 of a transformer 140 having a pair of secondary windings 141 and 142 which have terminals connected to the base electrodes of a pair of transistors 143 and 144. The other terminal of winding 141 is connected to the emitter of transistor 143 and to ground while the other terminal of winding 142 is connected to a circuit point 146 which is connected to the emitter of the transistor 144, through a capacitor 147 to ground and through a capacitor 143 to a power supply terminal 150. The collectors of transistors 143 and 144 are connected to terminals of a pair of primary windings 151 and 152 of a transformer 154 having a pair of center tapped secondary windings 155 and 156, the other terminal of winding 151 being connected to the circuit point 146 and the other terminal winding 152 being connected to the power supply terminal 150. In response to the signal from the oscillator 138, the transistors 143 and 144 conduct alternately through the windings 151 and 152, generating square wave voltages in the secondary windings 155 and 156.

The center tap of the secondary winding is grounded, the end terminals thereof being connected through a pair of diodes 158 to the line 73 to develop a negative DC voltage thereon and being connected through a pair of diodes 158 to the line 74 to develop a positive voltage thereon filter capacitors 159 and 160 being connected between lines 73 and 74 in ground. The end terminals of winding 156 are connected to lines 71 and 72 while the center tap thereof is connected to ground.

Figure 8:
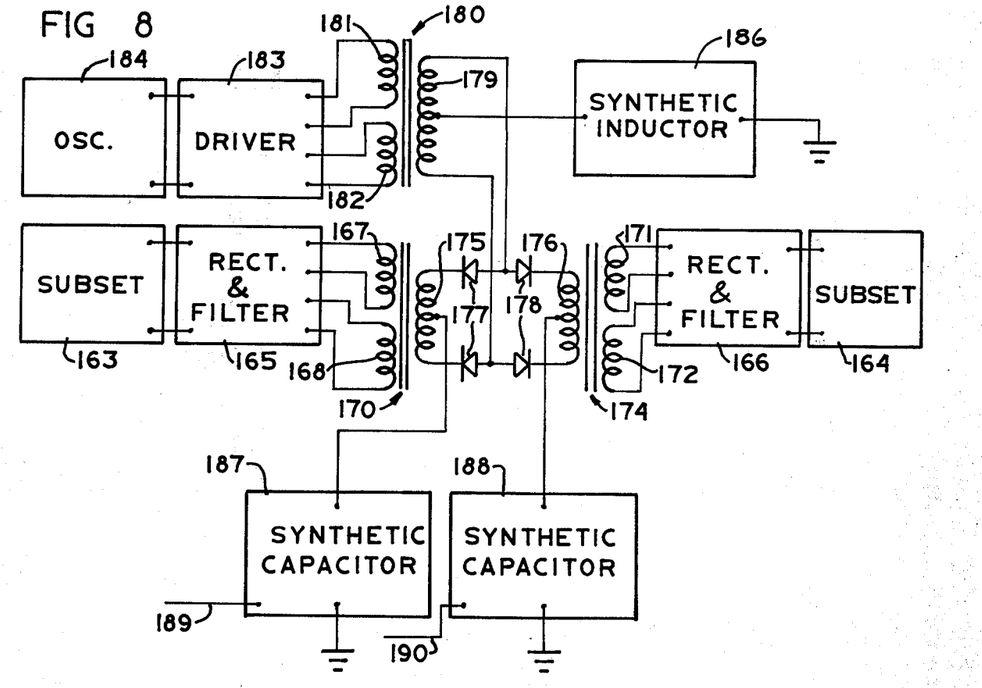
FIG. 8 is a schematic diagram of a modified circuit arrangement.

Referring to FIG. 8, reference numeral 162 generally designates a modified arrangement for signal transmission between a pair of subsets 163 and 164. Subsets 163 and 164 are connected to rectifier and filter circuits 165 and 166 each of which may include a pair of diode bridge rectifier circuits like the circuits 107 and 108 and a low pass filter circuit like the circuit 110. Circuit 165 is connected to a pair of windings 167 and 168 of a transformer 170 while circuit 166 is connected to a pair of windings 171 and 172 of a transformer 174.

Additional windings 175 and 176 of transformers 170 and 174 have end terminals connected through pairs of diodes 177 and 178 to end terminals of a secondary winding 179 of a transformer 180 having primary windings 181 and 182 connected to a river circuit 183 supplied with a signal from an oscillator 184. Driver circuit 183 may have circuitry similar to that in the inverter 76 shown in FIG. 7.

The center tap of the winding 179 is connected to ground through a synthetic inductor circuit 186 which may have a circuit like that of the circuit 104 of FIG. 6. The center taps of windings 175 and 176 are connected to ground through synthetic capacitor circuits 187 and 188 which ringing signals may be applied through lines 189 and 190.

The operation of the circuit arrangement of FIG. 8 is similar to that of the arrangement of FIGS. 5–7. In the arrangement of FIG. 8, the synthetic inductor circuit operates to provide a high impedance in common for two interface circuits, whereas in the circuit arrangement of FIGS. 5–7, there is one inductor circuit associated with each interface circuit.

Figure 9:
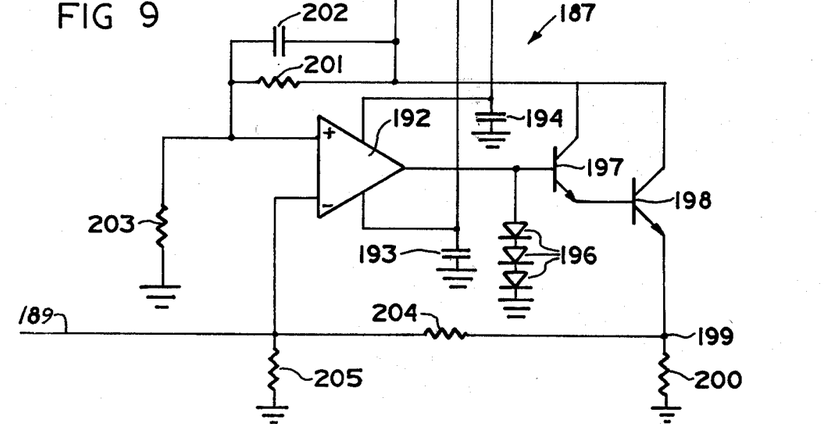
FIG. 9 is a circuit diagram of a synthetic capacitor used in the modified arrangement of FIG. 8.

FIG. 9 is a circuit diagram of the synthetic capacitor circuit 187, the other circuit 188 being the same. The circuit 187 comprises an operational amplifier 192 supplied with negative and positive operating voltages from a suitable source, by-pass capacitors 193 and 194 being connected between ground and the negative and positive supply voltage terminals of amplifier 192. The supply voltages on the lines connected to capacitors 193 and 194 may be minus 15 volts and plus 15 volts, by way of example.

The output of amplifier 192 is connected to ground through three serie diodes 196 and is also connected to the base of a transistor 197 having an emitter connected to the base of a transistor 198 the emitter of which is connected to a circuit point 199, connected through a resistor 200 to ground. The collectors of the transistors 197 and 198 are connected to the center tap of the primary winding 175. The plus input of amplifier 192 is connected through a resistor 201 and a parallel capacitor 202 to the center tap of winding 175 and is also connected through a resistor 203 to ground. The minus input of amplifier 192 is connected to line 189, through a resistor 204 to the circuit point 199 and through a resistor 205 to ground.

The circuit of the synthetic capacitor 187 is similar to that of the synthetic inductor 194, differing therefrom in that the parallel combination of the resistor 201 and the capacitor 202 is connected between the collectors of transistors 197 and 198 and the plus input of amplifier 192, instead of the arrangement with the series resistors 131 and 132 and the shunt capacitor 134 of the circuit 104. The operation is generally the same, however, a phase-shifted signal being applied to the plus input of the amplifier 192 in a manner such as to obtain synthetic capacitor operation. It is noted that in the circuit 187, a ringing signal or a DC bias signal, if desired, can be readily injected into the circuit at the minus input of the amplifier 192 as illustrated.

It will be understood that modifications and variations may be effected without departing from the novel concepts of this invention.

I claim as my invention:

1. A synthetic reactor circuit comprising transistor means, an operational amplifier having an output coupled to said transistor means for controlling conduction therethrough, and resistance-capacitance means responding to the voltage across said transistor means and applying a signal to the non-inverting input of said operational amplifier in phase-displaced relation from said voltage such that the effective impedance presented by said transistor means is a reactive impedance.

2. In a circuit as defined in claim 1, resistance means in series with said transistor means, said operational amplifier having a second input responsive to the voltage across said series resistance means.

* * * * *